US006974722B2

(12) United States Patent
Daves et al.

(10) Patent No.: US 6,974,722 B2
(45) Date of Patent: Dec. 13, 2005

(54) JOGGING STRUCTURE FOR WIRING TRANSLATION BETWEEN GRIDS WITH NON-INTEGRAL PITCH RATIOS IN CHIP CARRIER MODULES

(75) Inventors: Glenn G. Daves, Beacon, NY (US); Jason Frankel, Beacon, NY (US); William F. Shutler, Wappingers Falls, NY (US); Anthony Wayne Sigler, Pine Plains, NY (US); Herbert I. Stoller, Poughkeepsie, NY (US); John Vetrero, Marlboro, NY (US); Cathy Ann Zadany, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/709,012

(22) Filed: Apr. 7, 2004

(65) Prior Publication Data
US 2004/0188823 A1    Sep. 30, 2004

Related U.S. Application Data

(62) Division of application No. 09/989,666, filed on Nov. 20, 2001, now Pat. No. 6,762,489.

(51) Int. Cl.[7] .................. H01L 21/44; H01L 21/48; H01L 21/50

(52) U.S. Cl. ............. 438/106; 438/106; 438/107; 438/108

(58) Field of Search ................. 438/106, 108

(56) References Cited

U.S. PATENT DOCUMENTS

| | | | |
|---|---|---|---|
| 4,245,273 A * | 1/1981 | Feinberg et al. | 361/703 |
| 4,295,149 A | 10/1981 | Balyoz et al. | 357/45 |
| 4,713,773 A | 12/1987 | Cooper et al. | 364/491 |
| 4,782,193 A | 11/1988 | Linsker | 174/68.5 |
| 4,811,082 A | 3/1989 | Jacobs et al. | 357/80 |
| 5,060,116 A | 10/1991 | Grobman et al. | 361/474 |
| 5,074,037 A | 12/1991 | Sutcliffe et al. | 29/847 |
| 5,341,310 A | 8/1994 | Gould et al. | 364/491 |
| 5,488,542 A | 1/1996 | Ito | 361/793 |
| 5,544,069 A * | 8/1996 | Mohsen | 716/16 |
| 5,657,242 A | 8/1997 | Sekiyama et al. | 364/491 |
| 5,866,441 A | 2/1999 | Pace | 438/108 |
| 5,914,533 A * | 6/1999 | Frech et al. | 257/700 |
| 5,936,843 A | 8/1999 | Ohshima et al. | 361/760 |

(Continued)

Primary Examiner—Michael Lebentritt
Assistant Examiner—Ron Pompey
(74) Attorney, Agent, or Firm—James Cioffi; Cantor Colburn LLP

(57) ABSTRACT

A jogging structure for translating wiring connections from points in a first grid to corresponding points in a second grid in a chip carrier module is disclosed. In an exemplary embodiment, the structure includes a first translation layer, coupled to the first grid, the first translation layer translating the first grid in an x-axis direction. A second translation layer is coupled to the first translation layer, the second translation layer for translating said wiring connections from the first grid in a y-axis direction, the y-axis direction being orthogonal to the x-axis direction. The second translation layer is further coupled to the second grid.

3 Claims, 4 Drawing Sheets

U.S. PATENT DOCUMENTS

| | | | |
|---|---|---|---|
| 5,973,928 A | 10/1999 | Blasi et al. | 361/760 |
| 5,998,861 A | 12/1999 | Hiruta | 257/700 |
| 6,072,233 A * | 6/2000 | Corisis et al. | 257/686 |
| 6,161,215 A | 12/2000 | Hollenbeck et al. | 716/15 |
| 6,221,693 B1 * | 4/2001 | Ho | 438/108 |
| 6,228,468 B1 | 5/2001 | Vodrahalli | 428/210 |
| 6,489,181 B2 * | 12/2002 | Kado et al. | 438/108 |
| 6,528,735 B1 * | 3/2003 | Bhatia et al. | 174/260 |
| 6,617,243 B1 * | 9/2003 | Weekly | 438/637 |
| 2004/0229396 A1 * | 11/2004 | Shi et al. | 438/106 |

* cited by examiner

US 6,974,722 B2

JOGGING STRUCTURE FOR WIRING TRANSLATION BETWEEN GRIDS WITH NON-INTEGRAL PITCH RATIOS IN CHIP CARRIER MODULES

CROSS REFERENCE TO RELATED APPLICATIONS

This application is a divisional application of U.S. Ser. No. 09/989,666, filed Nov. 20, 2001, now U.S. Pat. No. 6,762,489, the contents of which are incorporated by reference herein in their entirety.

BACKGROUND OF THE INVENTION

The present disclosure relates generally to interconnection packaging for integrated circuits and, more particularly, to a structure and method for wiring translation between grids having non-integral pitch ratios in chip carrier modules.

Integrated circuit chips may be packaged in a variety of ways, depending upon the performance and reliability requirements of the system in which they are used. High end integration schemes, sometimes referred to as multi-chip modules (MCMs) or single chip modules (SCMs), normally include at least one integrated circuit chip which is mounted to an insulating substrate. The insulating substrate, which may be ceramic, for example, has one or more wiring layers therein and thus provides a medium for electrical connections between chips (on an MCM) and/or between modules (for an MCM or a SCM). The wiring layers of the substrate are terminated at each of the top and bottom surfaces of the substrate in an array of I/O pads for interfacing to the chip and to a circuit board or other higher level module. The I/O pads may be a part of a controlled collapse chip contact (C4), ball grid array (BGA) or other connection scheme.

In a conventional MCM design, a logic service terminal (LST) grid (or via grid) located in the substrate provides an interface between the redistributed power, ground and signal terminals from a chip, and an X-Y wiring area. The X-Y wiring area comprises X and Y wiring planes which establish connections from one chip to another chip, or from one chip to pins on the MCM substrate. Typically, the LST grid has a pitch which is an integral multiple of the pitch of the chip I/O grid (e.g., C4 grid) for ease of interconnection therebetween. However, such a dependent relationship may be disadvantageous in that neither the LST grid nor the C4 grid may be changed or redesigned independently of one another.

In the event of a design change in the LST grid (e.g., for device miniaturization purposes), there is a resulting corresponding change to the C4 grid in order to maintain an integral multiple pitch ratio therebetween. As a result of a change in the C4 grid, there is also a change in chip design, wafer probes, temporary chip attachments (TCAs), and the like. Conversely, a design change in a C4 grid results a corresponding change in the LST grid. As a result, a design change in the LST grid begs certain technological advances in process fabrication areas such as ceramics, punch diameter, line width, masks, green sheet (GS) thickness, pastes, and the like. Thus, it can be seen that a design change in one grid aspect of an MCM may lead to costly changes in other aspects of the MCM.

SUMMARY OF INVENTION

The foregoing discussed drawbacks and deficiencies of the prior art are overcome or alleviated by a jogging structure for translating wiring connections from points in a first grid to corresponding points in a second grid in a chip carrier module. In an exemplary embodiment, the structure includes a first translation layer, coupled to the first grid, the first translation layer translating the first grid in an x-axis direction. A second translation layer is coupled to the first translation layer, the second translation layer for translating said wiring connections from the first grid in a y-axis direction, the y-axis direction being orthogonal to the x-axis direction. The second translation layer is further coupled to the second grid.

In a preferred embodiment, the first translation layer further includes a first plurality of signal interconnects, the first plurality of signal interconnects each having a jog line elongated along the x-axis direction. The second translation layer further includes a second plurality of signal interconnects, the second plurality of signal interconnects each having a jog line elongated along the y-axis direction. Each of the jog lines in the first plurality of signal interconnects is disposed between an upper via contact and a lower via contact in the first translation layer. Similarly, each of the jog lines in the second plurality of signal interconnects is disposed between an upper via contact and a lower via contact in the second translation layer. Each individual upper via contact in the first translation layer is in electrical communication with a corresponding point in the first grid, while each individual lower via contact in the first translation layer is in electrical communication with a corresponding upper via contact in the second translation layer. Furthermore, each individual lower via contact in the second translation layer is in electrical communication with a corresponding point in the second grid. Preferably, the first grid is a C4 grid and the second grid is a logic service terminal (LST) grid.

BRIEF DESCRIPTION OF DRAWINGS

Referring to the exemplary drawings wherein like elements are numbered alike in the several Figures.

DETAILED DESCRIPTION

Figure 1:
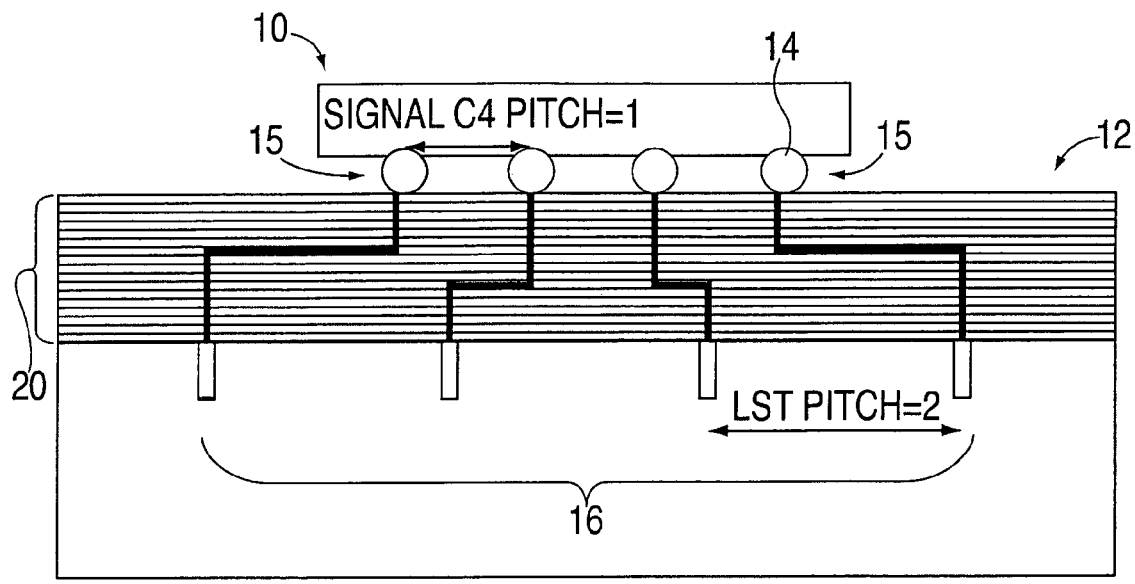
FIG. 1 is a cross-sectional view of an integrated circuit chip attached to a multichip module, particularly illustrating a schematical representation of a conventional wiring translation between a C4 grid and a logic service terminal (LST) grid within the module, wherein the pitch of the LST grid is an integral multiple of the pitch of the C4 grid.

Referring initially to FIG. 1, there is shown a cross-sectional view of an integrated circuit chip 10 attached to a module 12 which may be a single chip module (SCM) or a multichip module (MCM). Chip 10 is attached to module 12 by a plurality of C4 solder balls 14 defining a C4 grid 15. The individual C4 solder balls 14 have a pitch (spacing therebetween) designated by a unit length of one. The electrical connections of the C4 solder balls 14 (whether signal, power or ground) are fanned out to a corresponding logic service terminal (LST) grid 16 through conventional wiring structures in redistribution layers 20. As indicated earlier, the conventional wiring structures are designed to fan out the C4 signals such that the pitch of the fanned out signals at LST grid 16 is an integral multiple of the C4 pitch.

Figure 2:
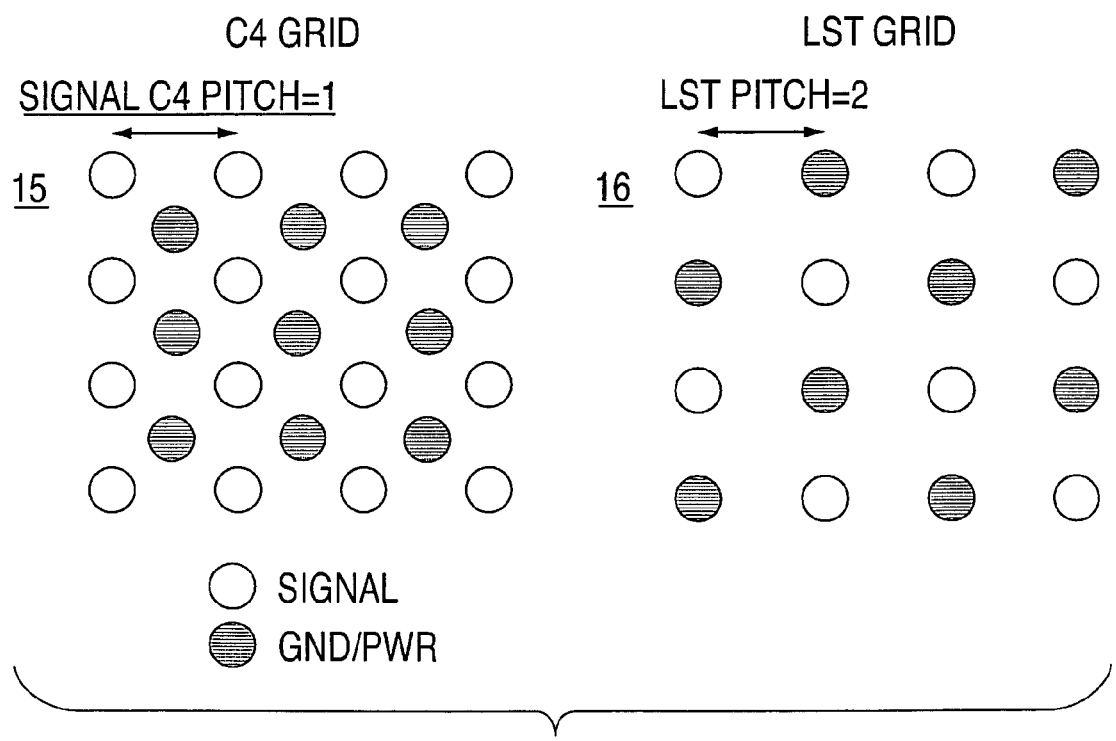
FIG. 2 is a top view of a portion of the C4 grid and corresponding LST grid of FIG. 1.

In the example illustrated, the fan out ratio is 2:1, meaning that the pitch of LST grid 16 is twice that of the C4 grid 15, as shown more particularly in FIG. 2. As also mentioned previously, however, a design change in either the C4 grid 15 or the LST grid 16 necessitates a change in the other because the conventional redistribution layers 20 are predefined to maintain the integral multiple pitch ratio. This predefined path is dependent upon the pitch ratio and, as such, cannot be changed independently for a only an LST grid change or only a C4 grid change.

Figure 3:
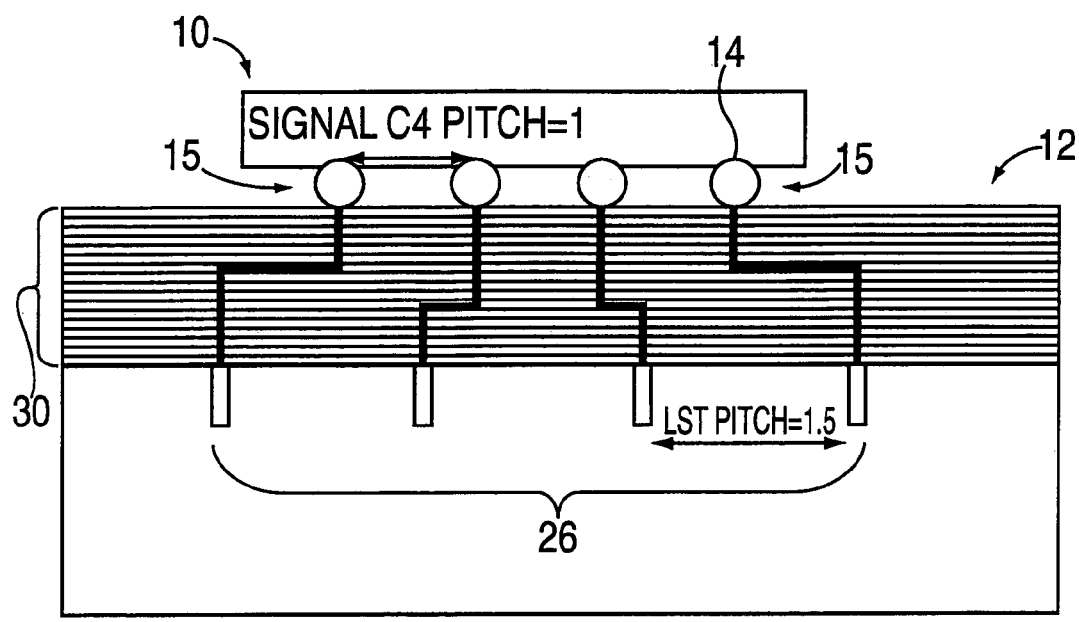
FIG. 3 illustrates a schematical representation of a novel method for implementing a wiring translation between a C4 grid and a logic service terminal (LST) grid within the module, wherein the pitch of the LST grid is not integral multiple of the pitch of the C4 grid, in accordance with an embodiment of the invention.
Figure 4:
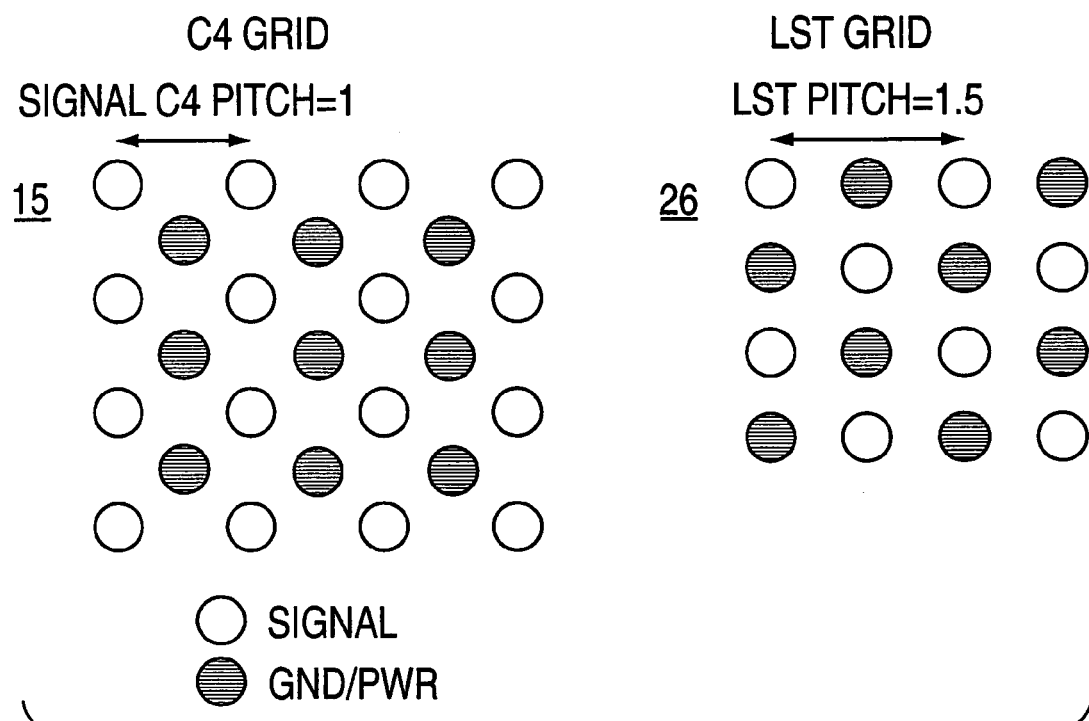
FIG. 4 is a top view of a portion of the C4 grid and corresponding LST grid of FIG. 3.

Therefore, in accordance with an embodiment of the invention, there is disclosed a novel method for implementing a wiring translation between a first grid and a second grid, regardless of whether or not the pitch of the second grid is an integral multiple of the first grid. An example of one possible translation is schematically illustrated in FIG 3. The C4 grid 15 of integrated circuit chip 10 is again defined to have a unit pitch length. However, in this instance, a design change in the module 12 has resulted in a modified LST grid 26 having a pitch of only 1.5 times that of the C4 grid 15. Accordingly, the locations of the signal, power and ground connections in the modified LST grid 26 of FIG. 3 will be different that those of LST grid 16 in FIG. 1. This difference can best be appreciated by referring to FIG. 4 and, more particularly, by a comparison of FIG. 4 and FIG. 2.

The flexibility in changing the pitch of the modified LST grid 26 to a non-integral multiple of the C4 pitch (and vice versa) without changing the pitch of the other is realized through a novel jogging structure included within modified redistribution layers 30 in FIG. 3. Briefly stated, the jogging structure translates a grid in a first direction (e.g., the x-axis direction) with a first translation layer and then translates the grid in a second direction (e.g., the y-axis direction) with a second translation layer. Thereby, the jogging structure allows an electrical fan-out between a C4 grid of an IC chip to an LST grid within a multichip module, regardless of the ratio of the pitch therebetween.

Figure 5A:
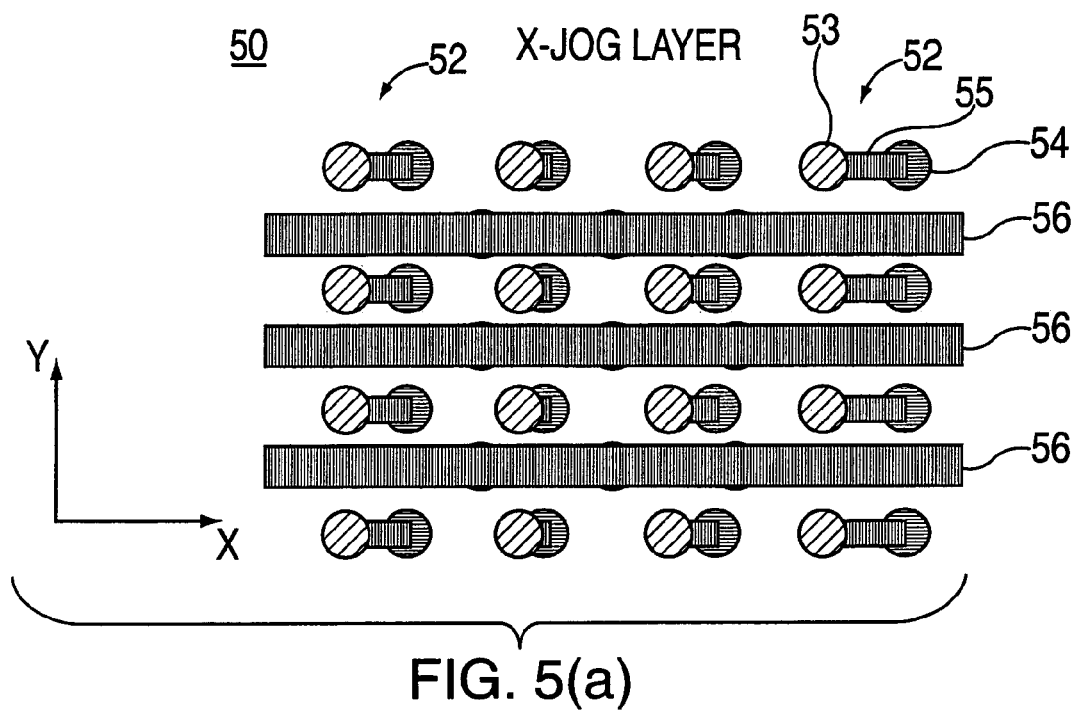
FIGS. 5(a) and 5(b) are top views of a jogging structure for translating a C4 grid through a first direction and a second direction so as to be correspondingly connected to an LST grid, as illustrated in FIGS. 3 and 4.
Figure 5B:
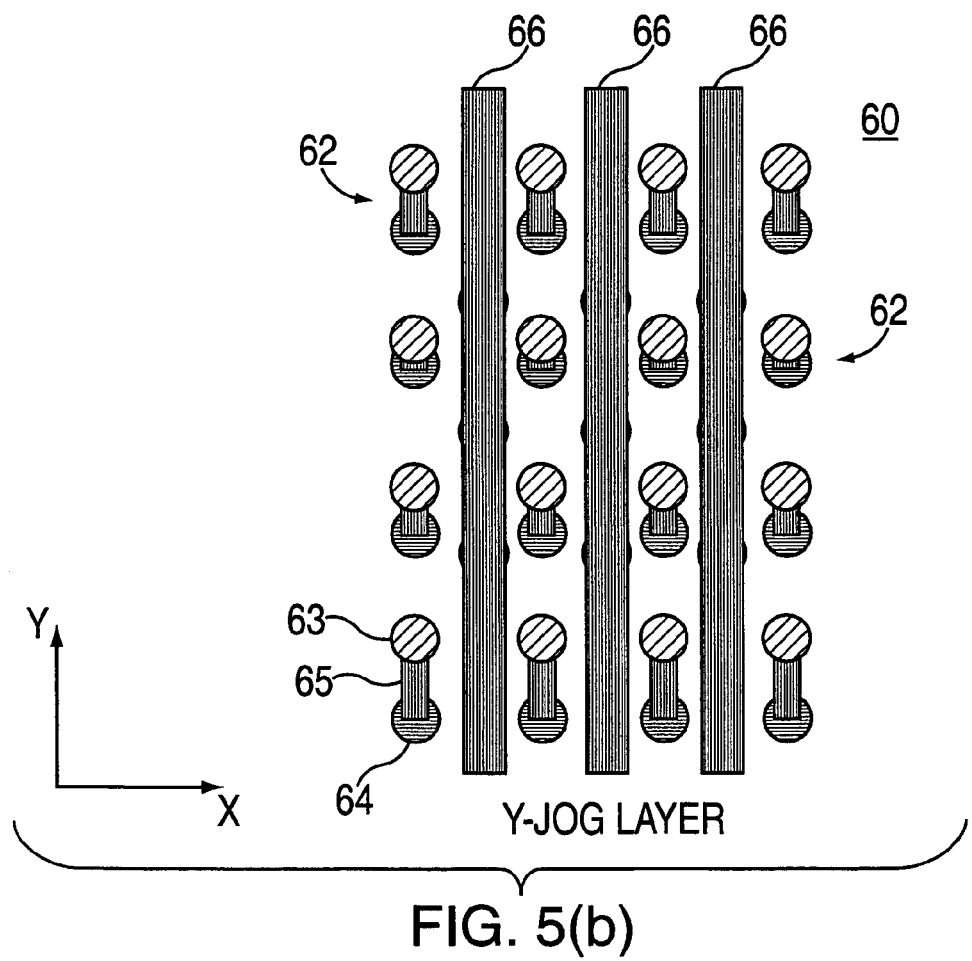
Figure 6:
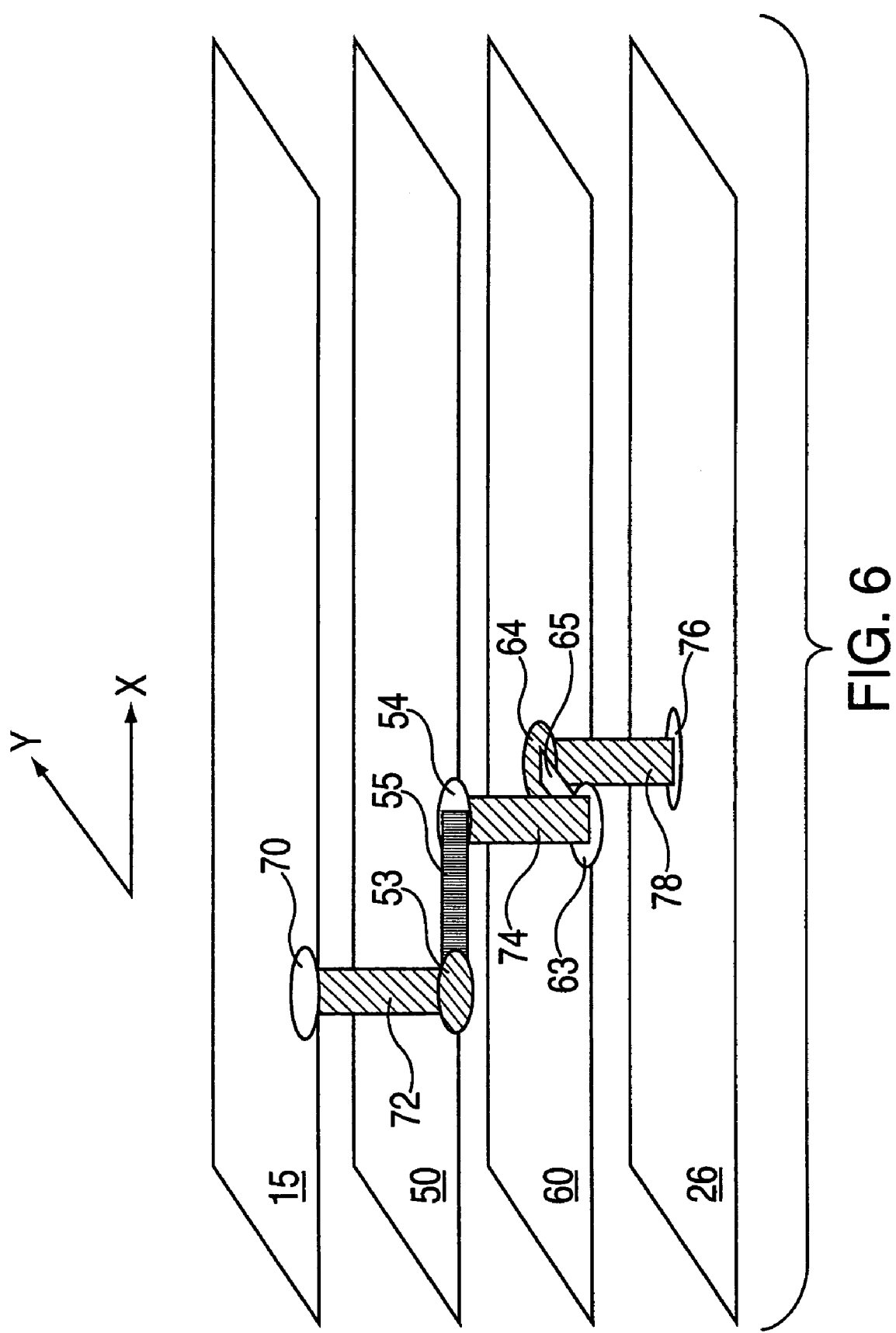
FIG. 6 is a cross-sectional perspective view of the interrelationship between the first and second translation layers included within the jogging structure.

The jogging structure is depicted generally in FIGS. 5(a), 5(b) and 6. FIG. 5(a) illustrates a top view of a first translation layer 50. First translation layer 50 includes a first plurality of signal interconnects 52 for translating a C4 grid connection in a first, or x-axis direction. Each signal 52 interconnect further includes an upper via contact 53 for vertical electrical connection to the C4 grid, as well as a lower via contact 54 for vertical electrical connection to a second translation layer, described hereinafter. The actual jogging (i.e., x-axis translation) is realized by elongated jog lines 55 which connect the upper and lower via contacts 53, 54 along the first, or x-axis direction. Also disposed in between rows of signal interconnects 52 in first translation layer 50 are power busses 56 which also run along the x-axis direction.

Correspondingly, FIG. 5(b) illustrates a second translation layer 60 that includes a second plurality of signal interconnects 62 for further translating the C4 grid in a second, or y-axis direction. Each signal interconnect 62 has an upper via contact 63 for vertical electrical connection to the first translation layer 50, with each upper via contact 63 being in vertical alignment with a corresponding lower via contact 54 in the first translation layer 50. Like-wise, each signal interconnect 62 further includes a lower via contact 64 for vertical electrical connection to the LST grid. The y-axis jogging is realized by elongated jog lines 65 which connect the upper and lower via contacts 63, 64 along the second, or y-axis direction. In addition, power busses 66 are disposed between columns of signal vias 62 and also run in the y-axis direction.

FIG. 6 illustrates the relationship between corresponding translated points in C4 grid 15 and LST grid 16, through the use of the jogging structure. A C4 connection 70 in the C4 grid 15 is connected to the upper via contact 53 in first translation layer through via 72. The jog line 55 then translates the C4 connection 70 in the x-axis direction, terminating at lower via contact 54. From there, another via 74 connects lower via contact 54 in first translation layer 50 to upper via contact 63 in second translation layer 60. Jog line 65 then translates into the y-axis direction and terminates at lower via contact 64. Finally, the translated connection is made from lower via contact to LST connection 76 through via 78.

Thus, it will be appreciated that used in conjunction with one another, first translation layer 50 and second translation layer 60 provide a bidirectional, X-Y translation of a given C4 connection to a corresponding LST terminal. The particular length of the individual jog lines 55 and 65 is dependent upon the grid pitch ratio and determines the range of translational distance between a C4 connection and an LST terminal. Accordingly, a design change (i.e., reduction) in the pitch of a C4 grid (or LST grid) may simply result in a corresponding design change to translation layers 50 and 60 without having to change the pitch of the LST grid (or C4 grid). The updated redistribution may be automatically generated and new jog line dimensions for translation layers 50, 60 are calculated.

While the invention has been described with reference to a preferred embodiment, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A method for implementing a wiring translation in chip carrier module between corresponding points in a first grid and a second grid, the points in the first grid defining a first plane and the points in the second grid defining a second plane, the second plane lying substantially parallel to the first plane, the method comprising:

connecting the first grid to a first translation layer within the module, said first translation layer translating the points in the first grid in a first direction, wherein said first translation layer is configured to include a first plurality of signal interconnects, said first plurality of signal interconnects each having a jog line elongated along an x-axis direction, and each of said jog lines in said first plurality of signal interconnects disposed between an upper via contact and a lower via contact in said first translation layer;

connecting a second translation layer between said first translation layer and the second grid, said second translation layer translating the points in the first grid in a second direction, said second direction being orthogonal to said first direction, wherein said second translation layer is configured to include a second plurality of signal interconnects, said second plurality of signal interconnects each having a jog line elongated along a y-axis dircetion, and each of said jog lines in said second plurality of signal interconnects disposed between an upper via contact and a lower via contact in said second translation layer; and configuring said first and second translation layers so as to fan signals out from the first grid to the second grid;

configuring a first plurality of power busses in said first translation layer, disposed along said x-axis direction; and configuring a second plurality of power busses in said second translation layer, disposed in said y-axis direction;

wherein each individual upper via contact in said first translation layer is in electrical communication with a corresponding point in the first grid;

each individual lower via contact in said first translation layer is in electrical communication with a corresponding upper via contact in said second translation layer; and each individual lower via contact in said second translation layer is in electrical communication with a corresponding point in the second grid; and individual signal vias in said first plurality of signal vias are in electrical contact with corresponding individual signal vias in said second plurality of signal vias.

2. The method of claim 1, wherein:

said first grid comprises a C4 grid; and said second grid comprises a logic service terminal (LST) grid.

3. A method for implementing a wiring translation in chip carrier module between corresponding points in a first grid and a second grid, the points in the first grid defining a first plane and the points in the second grid defining a second plane, the second plane lying substantially parallel to the first plane, the method comprising:

connecting the first grid to a first translation layer within the module, said first translation layer configured to include a first plurality of signal interconnects, each having a jog line elongated along an x-axis direction so as to translate the points in the first grid in a first direction;

connecting a second translation layer between said first translation layer and the second grid, said second translation layer configured to include a second plurality of signal interconnects, each having a jog line elongated along a y-axis direction so as to translate the points in the first grid in a second direction, said second direction being orthogonal to said first direction;

wherein each of said jog lines in said first plurality of signal interconnects is disposed between an upper via contact and a lower via contact in said first translation layer, and each of said jog lines in said second plurality of signal interconnects is disposed between an upper via contact and a lower via contact in said second translation layer;

wherein each individual upper via contact in said first translation layer is in electrical communication with a corresponding point in the first grid, each individual lower via contact in said first translation layer is in electrical communication with a corresponding upper via contact in said second translation layer, each individual lower via contact in said second translation layer is in electrical communication with a corresponding point in the second grid, and individual signal vias in said first plurality of signal vias are in electrical contact with corresponding individual signal vias in said second plurality of signal vias;

configuring a first plurality of power busses in said first translation layer, disposed along said x-axis direction; and configuring a second plurality of power busses in said second translation layer, disposed in said y-axis direction.

* * * * *